US005825216A

United States Patent [19]

Archer et al.

[11] Patent Number: 5,825,216

[45] Date of Patent: Oct. 20, 1998

[54] METHOD OF OPERATING A DRIVE CIRCUIT FOR A SOLENOID

[75] Inventors: Michael Anthony Archer, Middlesex; Paul Hodgetts, London, both of England; Carl Mannerfelt; Johan Larsson, both of Gothenburg, Sweden

[73] Assignees: Lucas Industries Public Limited Company, Solihull, England; AB Volvo, Gothenburg, Sweden

[21] Appl. No.: 788,785

[22] Filed: Jan. 24, 1997

Related U.S. Application Data

[63] Continuation of Ser. No. 491,346, Jun. 30, 1995, abandoned.

[30] Foreign Application Priority Data

Jul. 7, 1994 [GB] United Kingdom ................... 9413684

[51] Int. Cl.$^6$ ............................. H03K 3/00; F02M 39/00

[52] U.S. Cl. ............................................. 327/110; 123/490

[58] Field of Search ..................................... 327/108, 110, 327/168, 443, 439, 453, 454, 468, 475, 436; 123/205, 206, 457, 458, 445, 446, 490, 478, 477

[56] References Cited

U.S. PATENT DOCUMENTS

| | | | |
|---|---|---|---|
| 3,560,821 | 2/1971 | Beling | 327/110 |
| 3,930,171 | 12/1975 | Takahashi | 327/110 |
| 4,142,684 | 3/1979 | Schweitzer | 327/110 |
| 4,509,487 | 4/1985 | Mowbray | 123/458 |
| 4,581,594 | 4/1986 | Kennedy | 327/110 |
| 5,341,032 | 8/1994 | Brambilla et al. | 327/110 |
| 5,374,857 | 12/1994 | Carobolante | 327/110 |

FOREIGN PATENT DOCUMENTS

| | | | |
|---|---|---|---|
| 000647022 | 12/1990 | Australia | 327/110 |
| 0376493 | 7/1990 | European Pat. Off. . | |
| 4308811 | 1/1994 | Germany . | |

*Primary Examiner*—Timothy P. Callahan
*Assistant Examiner*—My-Trang Nu Ton
*Attorney, Agent, or Firm*—Jacobson, Price, Holman & Stern, PLLC

[57] ABSTRACT

A method of operating a drive circuit of a solenoid of an electromagnetic device including an armature, the drive circuit including switch means in series with the solenoid, comprising closing the switch means to achieve a high rate of current increase in the solenoid, opening the switch means when the current reaches a predetermined level and allowing the current to decay, the movement of the armature from a first to a second position being completed whilst the current is decaying and monitoring the decaying current using a sensing circuit which includes means responsive to a discontinuity in the decaying current flow when the armature reaches the second position.

3 Claims, 2 Drawing Sheets

METHOD OF OPERATING A DRIVE CIRCUIT FOR A SOLENOID

This is a Continuation of application Ser. No. 08/491,346, filed Jun. 30, 1995 which was abandoned upon the filing hereof.

BACKGROUND OF THE INVENTION

This invention relates to a drive circuit for controlling the flow of current in the solenoid of an electromagnetically operable valve in particular but not exclusively, a spill control valve of a fuel injection system for a compression ignition engine.

In an example of a fuel injection system there is provided a cam actuated plunger pump having a pumping plunger movable in a bore, the cam being driven in timed relationship with an associated engine. The bore has an outlet connected to a fuel injection nozzle of the engine and a fuel inlet through which fuel can flow to fill the bore with fuel prior to inward movement of the pumping plunger under the action of the cam to displace fuel from the bore. The spill control valve is connected to the bore and when open allows fuel to escape from the bore rather than flow through the outlet. Closure of the spill valve whilst the plunger is moving inwardly will result in delivery of fuel through the outlet to the associated engine. The valve member of the spill valve is moved to the closed position by supplying the associated solenoid with electric current by means of a drive circuit and the operation of the drive circuit is controlled by the engine electronic control system.

SUMMARY OF THE INVENTION

It is important to ensure that fuel is delivered to the associated engine at the correct time and for this reason it is desirable to be able to supply to the control system a signal which is indicative of closure of the valve member. The control system is then able to adjust the instant at which the drive circuit is rendered operative to energise the solenoid.

The drive circuit may comprise a semiconductor switch which is connected in series with the solenoid and a source of DC supply. The switch is turned on to achieve a high rate of current rise in the solenoid, the current being allowed to rise to a high peak level after which the current is allowed to decay and the current is then maintained at a lower holding level in order to maintain the valve member in the closed position. The switch is turned on and off to provide a mean holding current. In practice the supply voltage and the electrical characteristics of the solenoid are such that the valve member has only just started to move by the time the current has reached its peak level and the movement of the valve member is completed after the mean holding current has been established. It is found that this arrangement provides the desired speed of operation of the valve member with an acceptable power consumption and also minimum bounce of the valve member.

It has been observed that a discontinuity occurs in the decaying current flowing in the solenoid at the instant the valve member reaches the closed position but normally this discontinuity is masked by the current chopping action. This discontinuity arises because of the reduction in the rate of current decay as the valve member or more correctly the armature of the solenoid is brought to rest. A differentiating circuit can be used to detect the discontinuity.

It is proposed therefore to modify the operation of the drive circuit so as to provide a "window" during which the solenoid current is decaying and during which the valve member is expected to move to the closed position. The discontinuity can then be observed.

DESCRIPTION OF THE PREFERRED EMBODIMENTS

Figure 1:
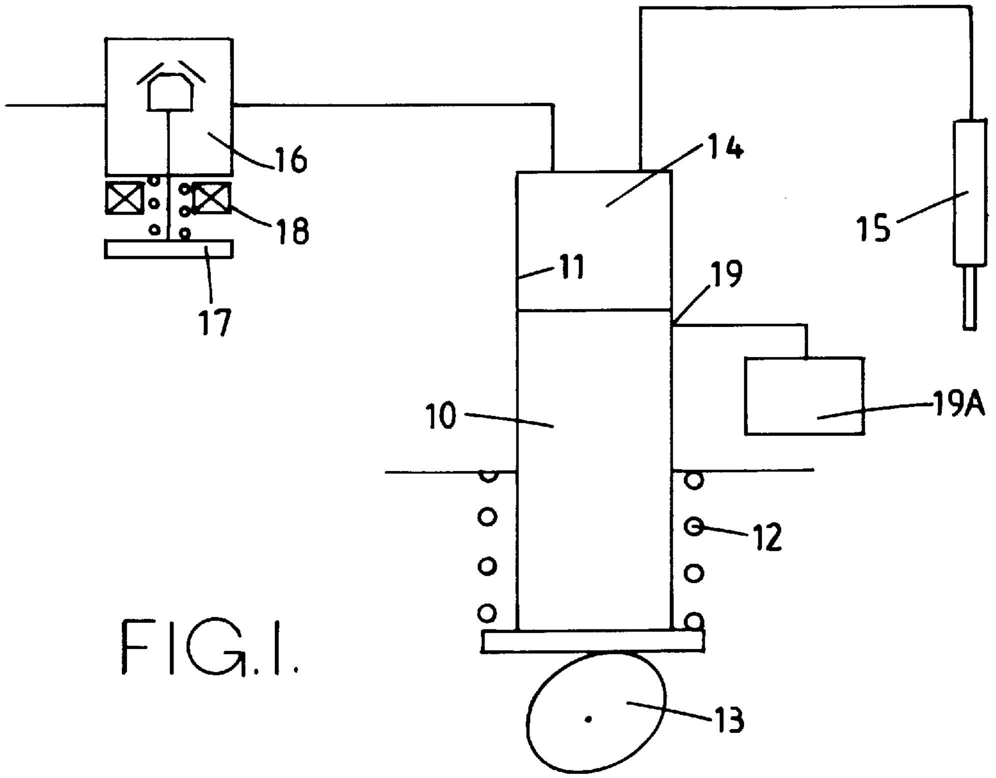
FIG. 1 is a diagrammatic representation of one example of an engine fuel system to which the invention may be applied.

With reference to FIG. 1 of the drawings the fuel injection system includes a fuel pump formed by a plunger 10 which is mounted within a bore 11. The plunger is biased outwardly of the bore by a spring 12 and is movable inwardly against the action of the spring, by an engine driven cam 13. The bore and plunger define a pumping chamber 14 having an outlet connected to a fuel injection nozzle 15. In addition the pumping chamber is connected to a drain through a spill valve 16 which has a valve member spring biased to the open position and movable to the closed position by a magnetic force acting upon an armature 17. The magnetic field is generated when a solenoid 18 is energised. When the plunger is actuated inwardly by the cam 13 and the spill valve is closed, fuel will be supplied to the associated engine through the injection nozzle 15. If the spill valve is opened the fuel displaced by the plunger flows to the drain and the supply of fuel to the engine ceases. The pumping chamber may be filled with fuel through the spill valve or as is shown, through a port 19 formed in the wall of the bore 11, when the port is uncovered by the plunger during its outward movement. The port 19 communicates with a source 19A of fuel under pressure.

Figure 2:
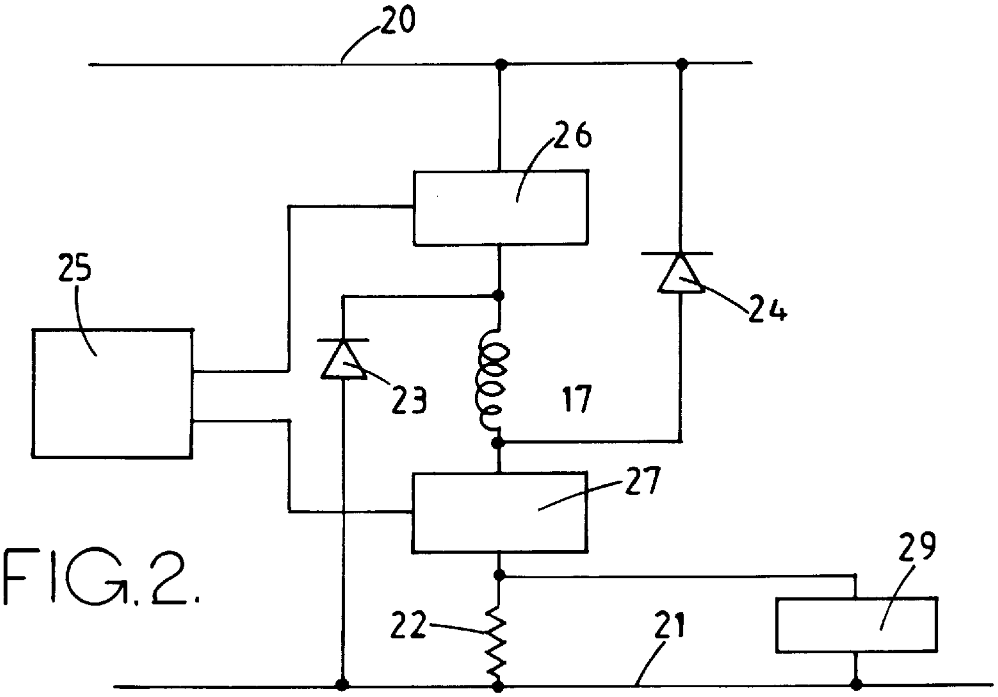
FIG. 2 shows one example of a drive circuit for a solenoid forming part of the fuel system of FIG. 1.

As shown in FIG. 2 a practical arrangement of the drive circuit includes positive and negative supply lines 20, 21 and first and second semiconductor switches 26, 27 connected between the ends of the solenoid winding 18 and the positive and negative supply lines respectively. In series with the switch 27 and the supply line 21 is a resistor 22 across which is developed a voltage which represents the current flowing in the second switch 27. The junction of the winding 18 and the first switch 26 is connected to the cathode of a first flywheel diode 23 and the anode of which is connected to the supply line 21. A second flywheel diode 24 has its anode connected to the junction of the winding 18 and the second switch 27 and its cathode connected to the supply line 20. The function of the switches is controlled by a logic circuit 25 and the voltage which is developed across the resistor 22 is applied to a sensing circuit 29 which may include a differentiating circuit.

In operation, when it is required to close the spill valve 16 both switches 26, 27 are turned on to achieve a rapid rate of rise of current flow in the winding. When the current reaches a peak value the switch 26 is opened to disconnect the winding from the supply. The current flow in the winding decays firstly at a low rate due to the action of the flywheel diode 23 and then when the switch 27 is opened at a higher rate through both flywheel diodes 23, 24 and the supply.

The armature and valve member do not start to move until the current has reached more or less the peak value.

Before the current flow falls to zero and before the valve member has moved into engagement with the seating both switches 26, 27 are closed for a short period to increase the current flow by a small amount and then switch 26 is opened so that the current decays at a low rate. This period of current decay is arranged so that closure of the valve member takes place therein and at the instant of closure a small glitch or discontinuity occurs in the current waveform. This is detected by the sensing circuit 29. Following the glitch or a predetermined time after opening the switch 26, it is reclosed and then switched to maintain a mean level of holding current for so long as it is required to maintain the spill valve closed.

Figure 3:
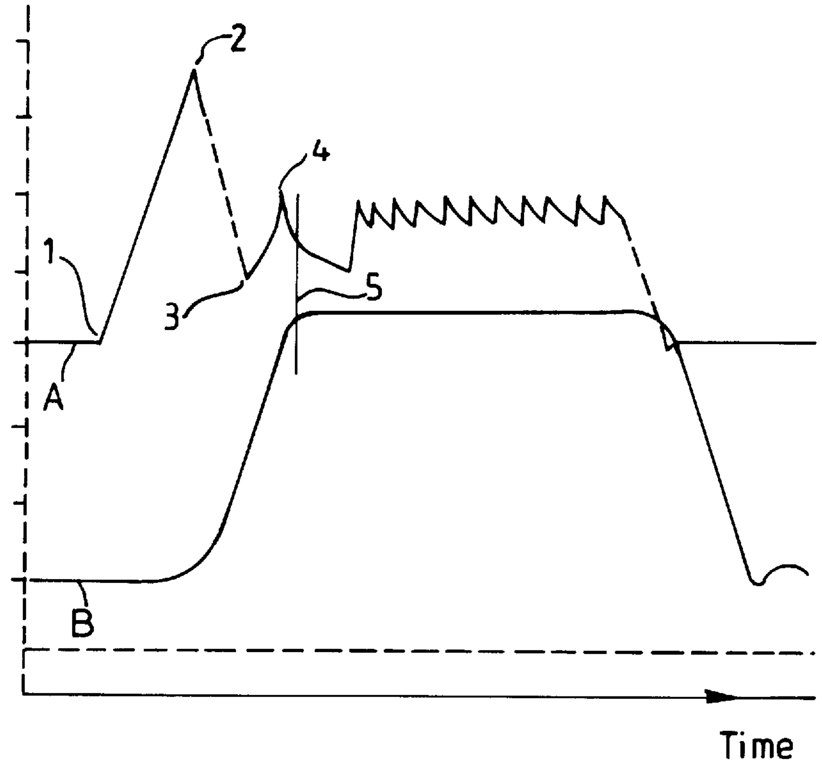
FIG. 3 is a graph showing current flow and armature movement.

The graph of FIG. 3 shows at A the current flowing in the solenoid and at B the armature and valve member movement. At instant 1 both semiconductor switches are turned on and a rapid rate of rise of current in the solenoid takes place, the current reaching a peak value at instant 2. In the example the armature and valve member start to move just before the peak value of the current is reached. At instant 2 the switch 26 is turned off and the current is allowed to decay initially at a low rate through the flywheel diode 23 and then when switch 27 is opened, at a higher rate through both diodes and the supply, until it reaches at instant 3, a value which is below the mean holding current. Both switches are then turned on and at instant 4 the current reaches the peak holding value. The majority of the armature and valve member movement takes place in the intervals between instants 2 and 3 and 3 and 4. At instant 4 the switch 26 is again opened and the current is allowed to decay at the low rate. Instant 4 is arranged to take place just before the armature and valve member are brought to rest and at the instant of valve closure indicated by the line 5, the discontinuity in the decaying current takes place.

It would be possible to allow the current to decay naturally from the peak value at instant 2 until just after valve closure has taken place. This however would impair the operation of the valve and for this reason the semiconductor switch is turned on between instants 3 and 4. In FIG. 3 the portions of the current waveform where there is a high rate of decay as when both switches are opened, is shown in dash lines because once switch 27 is turned off no current flows in the resistor 22.

We claim:

1. A method of operating a drive circuit which controls the flow of current in a solenoid winding of an electromagnetically operable valve having an armature coupled to a valve member, the armature and valve member being movable from a first position to a second position under the influence of a magnetic field generated by the solenoid winding, the solenoid winding having electrical characteristics such that movement of the armature is completed after the current in the solenoid winding has reached a peak value, the drive circuit including switch means connected in series with the solenoid winding, the method comprising the steps of: closing said switch means to achieve a rapid rise in current flow in the solenoid winding, opening said switch means for a period when the current flowing in the winding attains the peak value to allow the current flow to decay, during part of which period the solenoid winding generates a back EMF which causes the current flowing in the solenoid winding to decay at a rate which is higher than a natural rate of current decay of the solenoid winding, the movement of the armature and the valve member from the first position to the second position being completed while the current is decaying at the natural rate, monitoring the decaying current flow using a sensing circuit capable of sensing a discontinuity in the decaying current flow when the armature and valve member reach the second position and interrupting the period of current decay by reclosing and opening said switch means to achieve a limited increase in the current flowing in the solenoid winding before the armature and valve member reach said second position.

2. A method according to claim 1, including the further step of modifying the rate of current decay following attainment of said peak value of current whereby the rate of current decay before reclosure and opening of said switch means, is initially at a low rate and then at a high rate.

3. A method according to claim 2, in which following detection of the discontinuity, the switch means is turned on and off to provide a mean current flow in the solenoid winding sufficient to maintain said armature and valve member in said second position.

* * * * *